United States Patent
Sanada

(10) Patent No.: US 12,376,259 B2
(45) Date of Patent: Jul. 29, 2025

(54) COOLING DEVICE FOR ELECTRONIC APPARATUS

(71) Applicant: TOSHIBA TEC KABUSHIKI KAISHA, Tokyo (JP)

(72) Inventor: Tsuyoshi Sanada, Susono Shizuoka (JP)

(73) Assignee: TOSHIBA TEC KABUSHIKI KAISHA, Tokyo (JP)

(*) Notice: Subject to any disclaimer, the term of this patent is extended or adjusted under 35 U.S.C. 154(b) by 243 days.

(21) Appl. No.: 18/334,403

(22) Filed: Jun. 14, 2023

(65) Prior Publication Data

US 2024/0206109 A1 Jun. 20, 2024

(30) Foreign Application Priority Data

Dec. 20, 2022 (JP) .................. 2022-202940

(51) Int. Cl.
*H05K 7/20* (2006.01)
*G06F 1/20* (2006.01)

(52) U.S. Cl.
CPC ......... *H05K 7/20154* (2013.01); *G06F 1/206* (2013.01); *H05K 7/2039* (2013.01)

(58) Field of Classification Search
CPC ... H01L 23/3672; H01L 23/4093; G06F 1/20; G06F 1/206; G06F 2200/201; G06F 1/203; H05K 7/20154; H05K 7/20145; H05K 7/2039; H05K 7/20172; H05K 7/20409; H05K 7/20727; H05K 7/20745; F24F 1/0029; F24F 1/0059; F24F 13/082; F24F 13/20; F24F 2013/0616; B60H 1/00042; B60H 1/00; B01D 2267/70; B01D 2273/14; B01D 2279/50; B01D 46/0006; B01D 46/12; B01D 46/18; F28D 2021/0029; F28D 5/00

See application file for complete search history.

(56) References Cited

U.S. PATENT DOCUMENTS

| | | | | |
|---|---|---|---|---|
| 5,504,651 A * | 4/1996 | Atarashi | ............... | H01L 23/467 257/722 |
| 5,592,363 A * | 1/1997 | Atarashi | ............... | H01L 23/467 361/689 |
| 7,643,292 B1 * | 1/2010 | Chen | ................. | G06F 1/20 361/695 |
| 9,679,275 B2 * | 6/2017 | Bruscoe | ............... | G06Q 20/065 |

(Continued)

*Primary Examiner* — Michael A Matey
(74) *Attorney, Agent, or Firm* — Amin, Turocy & Watson, LLP

(57) ABSTRACT

A cooling device for an electronic apparatus includes a heat sink configured to dissipate heat generated from the electronic apparatus by allowing air introduced from the outside to pass between a plurality of fins, a first air blower that has a first discharge surface for discharging air introduced from the outside toward the heat sink, a second air blower that has the same size as the first air blower and has a second discharge surface for discharging air. A sum of a diameter of the first discharge surface and a diameter of the second discharge surface is larger than a width of the heat sink, and the first discharge surface and the second discharge surface are disposed upstream of the fins in a manner of being symmetrical relative to a plane with an included angle of 90 degrees or more between the first discharge surface and the second discharge surface.

20 Claims, 9 Drawing Sheets

(56) References Cited

U.S. PATENT DOCUMENTS

| | | | |
|---|---|---|---|
| 10,925,183 B2* | 2/2021 | Chiang | H05K 7/20154 |
| 2003/0042003 A1* | 3/2003 | Novotny | H05K 7/20172 |
| | | | 165/47 |
| 2005/0041392 A1* | 2/2005 | Chen | H05K 7/20727 |
| | | | 361/695 |
| 2005/0286226 A1* | 12/2005 | Ishii | H05K 7/20918 |
| | | | 257/E23.099 |
| 2009/0040718 A1* | 2/2009 | Liu | G06F 1/20 |
| | | | 361/697 |
| 2009/0183865 A1* | 7/2009 | Miyahara | H01L 23/467 |
| | | | 165/47 |
| 2013/0083253 A1* | 4/2013 | Maeshima | G06F 1/20 |
| | | | 348/739 |
| 2022/0264759 A1* | 8/2022 | Sawyer | G06F 1/20 |

\* cited by examiner

COOLING DEVICE FOR ELECTRONIC APPARATUS

CROSS-REFERENCE TO RELATED APPLICATION

This application is based upon and claims the benefit of priority from Japanese Patent Application No. 2022-202940, filed on Dec. 20, 2022, the entire contents of which are incorporated herein by reference.

FIELD

Embodiments described herein relate generally to a cooling device for an electronic apparatus.

BACKGROUND

In the related art, an electronic apparatus such as a personal computer (PC) includes a high-temperature component such as a central processing unit (CPU). A heat sink is generally attached to such a component for heat dissipation. Air suctioned by a fan installed upstream flows to the heat sink and is exhausted downstream of the heat sink, so that heat is dissipated.

Recently, there is a strong demand for miniaturization of an electronic apparatus, and there is a demand for miniaturization of a cooling fan that blows air to a heat sink. However, when a cooling fan is miniaturized, a discharge amount of cooling air is reduced, and thus cooling performance of a heat sink is low, which is not preferable.

DETAILED DESCRIPTION

In general, according to one embodiment, there is provided a cooling device for an electronic apparatus in which miniaturization of a cooling fan can be implemented without reducing a discharge amount of cooling air.

A cooling device for an electronic apparatus according to an embodiment includes a heat sink, a first air blower, a second air blower, and an exhaust port. The heat sink dissipates heat generated from the electronic apparatus by allowing air introduced from the outside to pass between a plurality of fins. The first air blower has a first discharge surface for discharging air introduced from the outside toward the heat sink. The second air blower has the same size as the first air blower, and has a second discharge surface for discharging air introduced from the outside toward the heat sink. The exhaust port discharges air that passed between the fins to the outside. A sum of a diameter of the first discharge surface and a diameter of the second discharge surface is larger than a width of the heat sink, and the first discharge surface and the second discharge surface are disposed upstream of the fins in a manner of being symmetrical relative to a plane with an included angle of 90 degrees or more between the first discharge surface and the second discharge surface. The plane passes through a central position in a width direction of the heat sink and is parallel to the fins.

An embodiment in which a cooling device is applied to a fan duct 1 will be described with reference to the drawings.

(Schematic Structure of Fan Duct)

Figure 1:
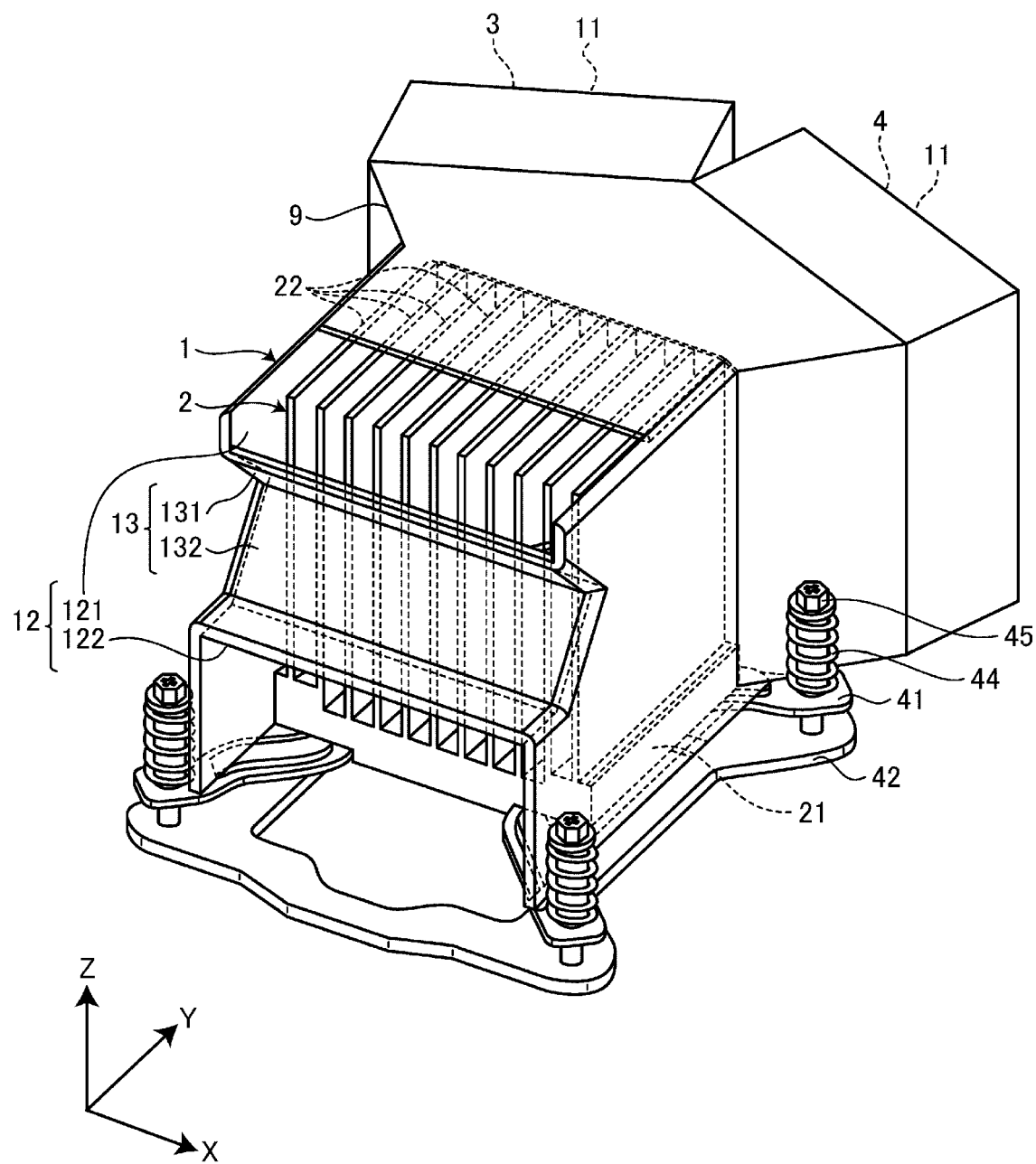
FIG. 1 is a perspective view illustrating an example of a fan duct according to an embodiment.
Figure 2:
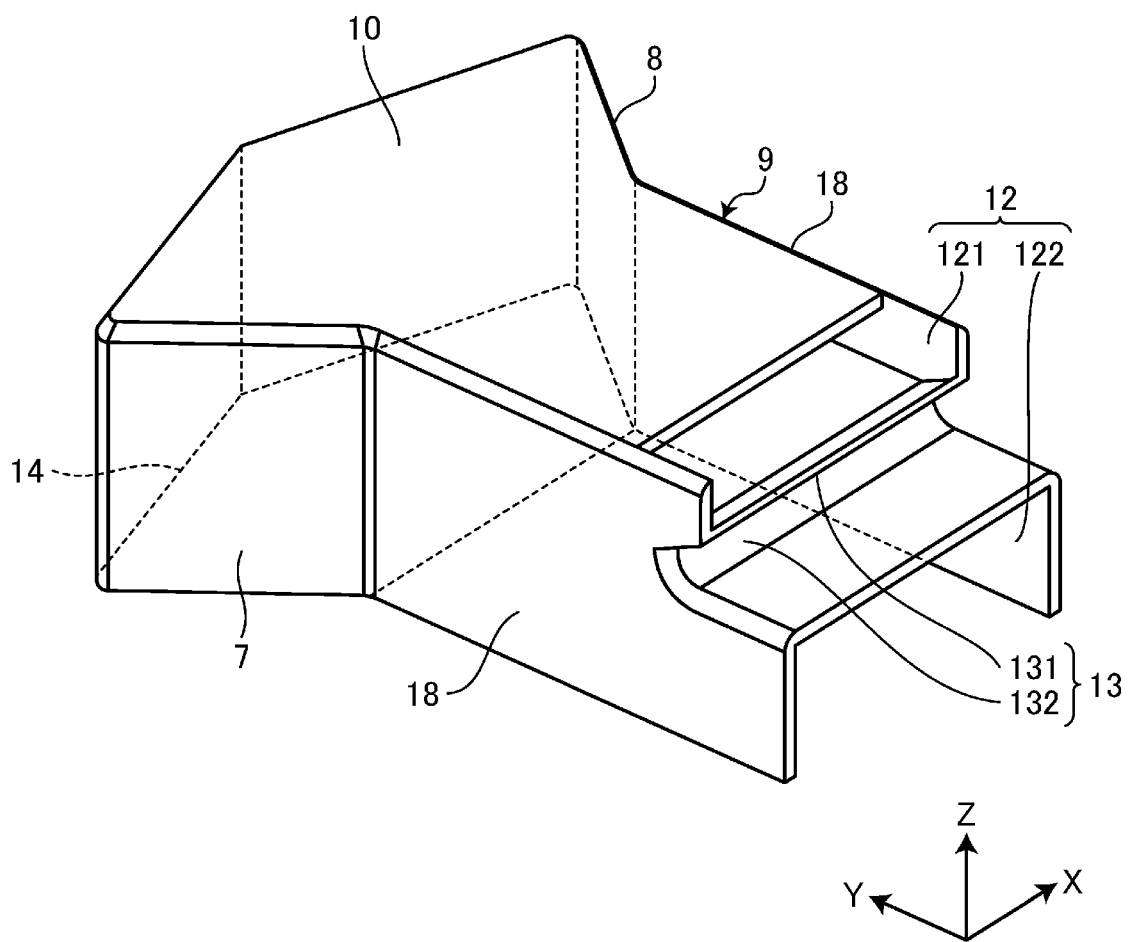
FIG. 2 is a perspective view illustrating an example of a casing in which the fan duct is constituted.

A schematic structure of the fan duct 1 serving as an example of a cooling device disclosed herein will be described with reference to FIGS. 1 and 2. FIG. 1 is a perspective view illustrating an example of the fan duct according to an embodiment. FIG. 2 is a perspective view illustrating an example of a casing that forms the fan duct. For convenience of explanation, a three-dimensional coordinate system XYZ illustrated in FIGS. 1 and 2 is set. In the three-dimensional coordinate system XYZ, a width direction (a left-right direction) of the fan duct 1 is defined as an X-axis direction, a depth direction (a front-rear direction) is defined as a Y-axis direction, and a height direction (an up-down direction) is defined as a Z-axis direction.

As illustrated in FIG. 1, the fan duct 1 includes a substantially box-shaped casing 9, and is a cover member that covers a heat sink 2 and covers a suction fan 3 and a suction fan 4 that blow air to the heat sink 2. The fan duct 1 is a member including a so-called intake duct and an exhaust duct, in which air suctioned by the suction fan 3 and the suction fan 4 from intake ports 11 passes between fins 22 of the heat sink 2 installed inside a ventilation pipe (duct) and the air is exhausted from an exhaust port 12.

The suction fan 3 and the suction fan 4 suction air outside the fan duct 1, introduce the suctioned air into the fan duct 1, and blow the air in a negative direction of a Y axis. The suction fan 3 is an example of a first air blower disclosed herein. The suction fan 4 is an example of a second air blower disclosed herein. In the fan duct 1, the intake port 11 is provided upstream in an air blowing direction of the suction fan 3 and upstream in an air blowing direction of the suction fan 4, and the exhaust port 12 is provided downstream.

The suction fan 3 has a first discharge surface for discharging air introduced from the outside toward the heat sink 2. The suction fan 4 has a second discharge surface for discharging air introduced from the outside toward the heat sink 2.

The suction fan 3 and the suction fan 4 have the same size, and are symmetrically arranged relative to a plane with an included angle of 90 degrees or more between the suction fan 3 and the suction fan 4. The plane passes through a central position in a width direction of the heat sink 2 along an X axis and is parallel to the fins 22 (a plane parallel to an YZ plane). Details will be described later (see FIGS. 5 and 6).

The heat sink 2 is attached to a heat generating electronic component such as a central processing unit (CPU). Heat generated by the CPU is conducted through the heat sink 2. The heat conducted through the heat sink 2 is dissipated to surrounding air. Accordingly, malfunction or the like due to overheating of the CPU is prevented.

The heat sink 2 includes a base portion 21 and a plurality of fins 22. The fins 22 stand on the base portion 21. The plurality of fins 22 are adjacent to one another at a predetermined interval. The base portion 21 is in contact with the CPU, and conducts heat of the CPU. The fins 22 dissipate the heat conducted from the base portion 21 into air.

The heat sink 2 is fixed by a helical spring 44 and a screw 45 on frames 41 and 42 that form layers at a predetermined interval. A mother board 101 (see FIG. 3) is interposed between the frame 41 and the frame 42.

The suction fan 3 and the suction fan 4 blow air by, for example, continuously blowing air in one direction with blades rotationally driven by an electric motor. In the present embodiment, the intake port 11, the suction fan 3 or the suction fan 4, the heat sink 2, and the exhaust port 12 are arranged in this order from upstream to downstream in the air blowing direction of the suction fan 3 or the suction fan 4.

In order to sufficiently exhibit the effect of the fan duct 1 described above, it is desirable that no component (obstacle) that prevents air exhaustion be present on a leeward side of the exhaust port 12. However, an obstacle may be arranged downstream of the exhaust port 12 depending on a size of an electronic apparatus 100 (see FIG. 3) including the fan duct 1, an arrangement of built-in components, and the like.

In this manner, in order to exhaust air while avoiding such obstacles on the leeward side, the fan duct 1 includes a branch wall 13 illustrated in FIG. 1. The branch wall 13 causes a flow of air that passed between the fins 22 of the heat sink 2 to branch in two directions. The branch wall 13 will be described in detail later (see FIG. 7).

As illustrated in FIG. 2, the casing 9 that constitutes the fan duct 1 has a shape of being opened on a side where the suction fan 3 and the suction fan 4 are attached and a side where the exhaust port 12 is provided.

A top plate 10 is provided on an upper portion of the casing 9 in the Z-axis direction, and a bottom plate 14 is provided on a lower portion of the casing 9 in the Z-axis direction. Side walls 18 are provided at both ends of the casing 9 in the X-axis direction at positions where the casing 9 covers the heat sink 2. Further, a side wall 7 is provided between the top plate 10 and the bottom plate 14 at a position between the heat sink 2 and an opening portion upstream (a Y-axis positive side) where the suction fan 3 is provided. A side wall 8 is provided between the top plate 10 and the bottom plate 14 at a position between the heat sink 2 and an opening portion upstream (the Y-axis positive side) where the suction fan 4 is provided. Accordingly, air discharged from the suction fan 3 reaches the heat sink 2 without leaking from the fan duct 1. Air discharged from the suction fan 4 reaches the heat sink 2 without leaking from the fan duct 1. The side wall 7 and the side wall 8 are an example of first wall portions disclosed herein.

The branch wall 13 is formed downstream (a Y-axis negative side) of the casing 9. The branch wall 13 includes an upper wall portion 131 and a lower wall portion 132. A part of air that passed between the fins 22 of the heat sink 2 flows along the upper wall portion 131 and is discharged from an upper exhaust port 121. Remaining air that passed between the fins 22 of the heat sink 2 flows along the lower wall portion 132 and is discharged from a lower exhaust port 122.

(Schematic Structure of Electronic Apparatus)

Figure 3:
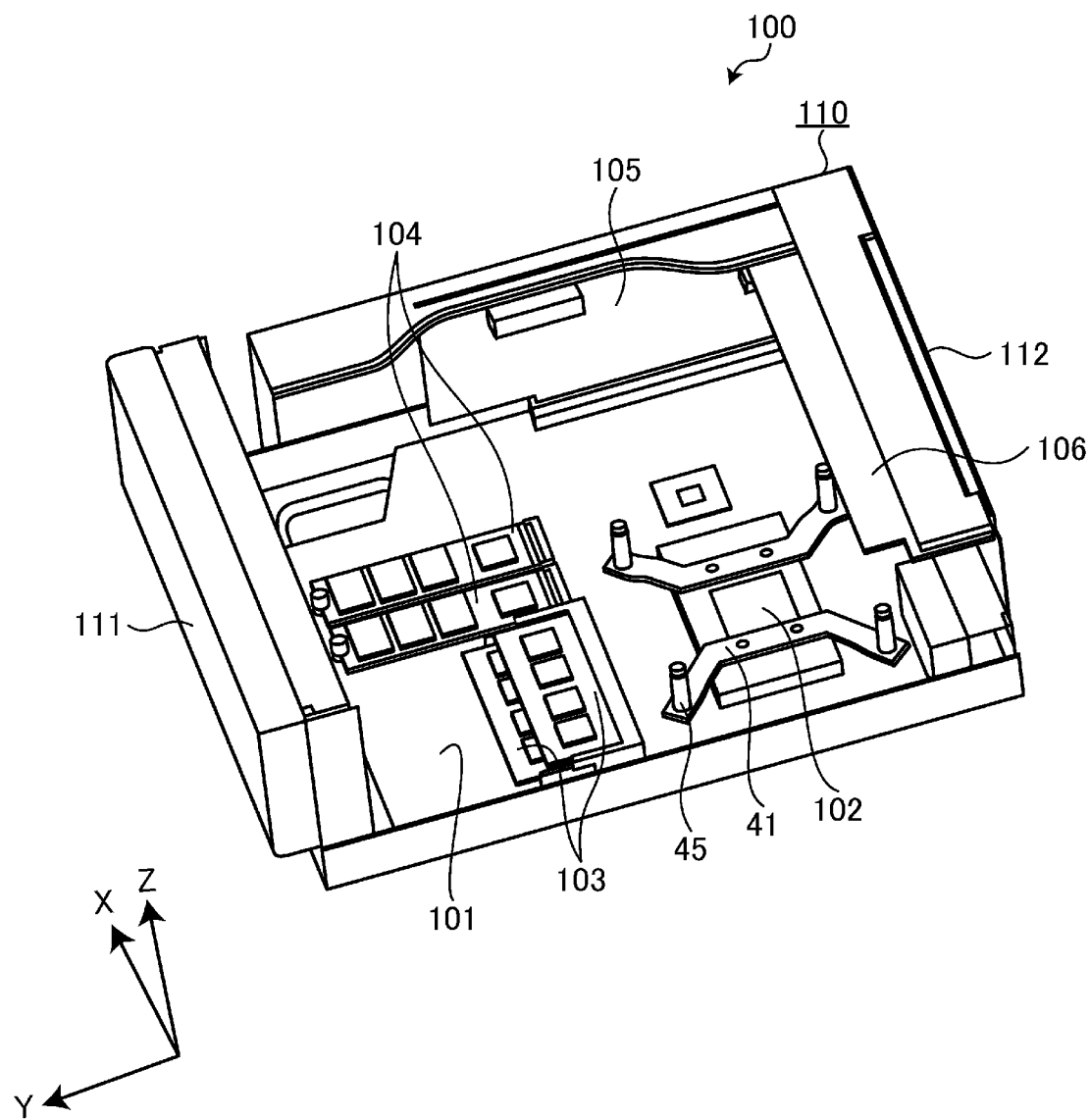
FIG. 3 is a perspective view illustrating an example of a schematic structure of an electronic apparatus to which the fan duct is attached.
Figure 4:
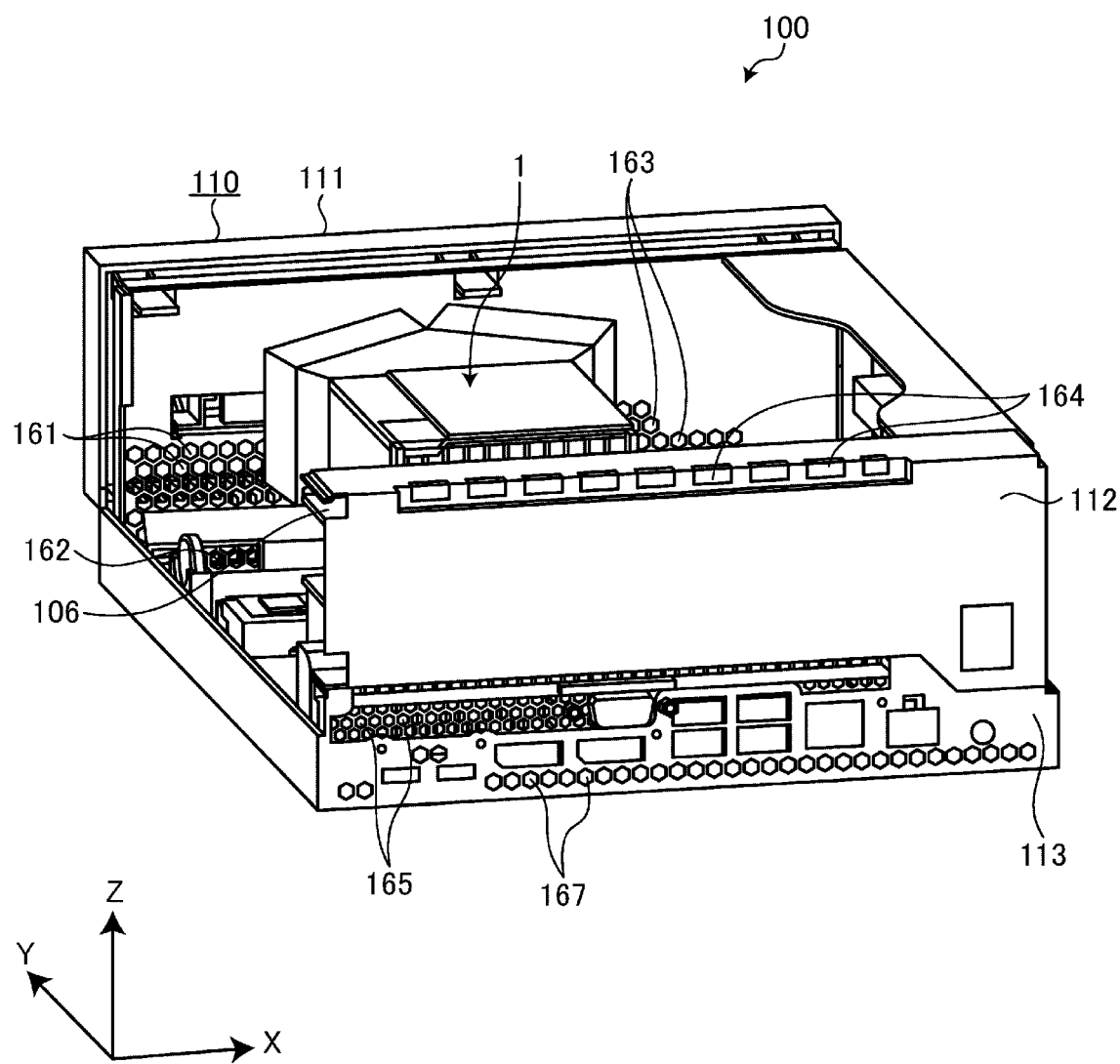
FIG. 4 is a perspective view illustrating an example of ventilation holes provided in the electronic apparatus.

The electronic apparatus 100 to which the fan duct 1 is attached will be described with reference to FIGS. 3 and 4. FIG. 3 is a perspective view illustrating an example of a schematic structure of an electronic apparatus to which a fan duct is attached. FIG. 4 is a perspective view illustrating an example of ventilation holes provided in the electronic apparatus.

As illustrated in FIG. 3, the electronic apparatus 100 includes the mother board 101, a CPU 102, a memory 103, a solid state drive (SSD) 104, a riser card 105, and an I/O board 106 inside a casing 110.

The mother board 101 is an example of a substrate on which an electronic component (the CPU 102 in the present embodiment) that generates heat from the heat sink 2 is mounted. The memory 103 and the SSD 104 also generate heat according to an operation. This heat is dissipated by a flow of air in the casing 110, and the flow of air is generated by air blown by the suction fan 3 and the suction fan 4.

The I/O board 106 is connected to the mother board 101 via an insertion port (a slot) of the riser card 105. Since the I/O board 106 is arranged parallel to the mother board 101 by being connected to the insertion port of the riser card 105, it is possible to reduce a height dimension of the casing 110.

With the arrangement described above, when the I/O board 106 is located downstream of the exhaust port 12, the I/O board 106 becomes an obstacle that prevents air exhaustion. In the present embodiment, air exhausted from the fan duct 1 avoids the I/O board 106.

As illustrated in FIG. 4, the fan duct 1 is housed inside the casing 110 of the electronic apparatus 100. The casing 110 is provided with ventilation holes 161, 162, and 163 for taking in air to be introduced into the fan duct 1, and ventilation holes 164, 165, and 167 for exhausting air that passed through the fan duct 1.

The ventilation holes 161, 162, and 163 are provided in a front cover 111 that constitutes a front surface of the casing 110. The ventilation holes 164 are provided in a rear cover 112 that constitutes a back surface of casing 110. The ventilation holes 165 and 167 are provided in an I/O panel 113 that constitutes a part of the back surface of the casing 110. The I/O panel 113 includes connection terminals for various peripheral devices to connect to the electronic apparatus 100.

The electronic apparatus 100 according to the present embodiment is provided with the I/O board 106 at rear of the CPU 102. Therefore, the exhaust port 12 of the fan duct 1 is divided into the upper exhaust port 121 that opens upward and the lower exhaust port 122 that opens downward, so that exhausted air avoids the I/O board 106 (see FIGS. 1 and 2). Specifically, the exhaust port 12 is divided into the upper exhaust port 121 and the lower exhaust port 122 by the branch wall 13 illustrated in FIGS. 1 and 2.

(Arrangement Structure of Suction Fans)

Figure 5:
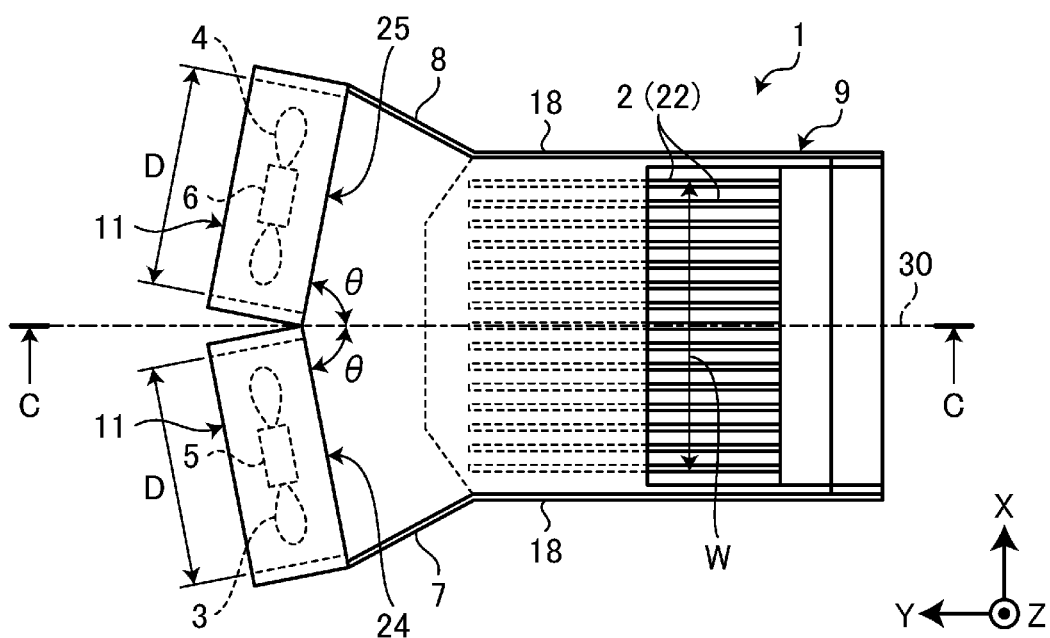
FIG. 5 is a plan view illustrating an example of an arrangement state of suction fans in the fan duct.
Figure 6:
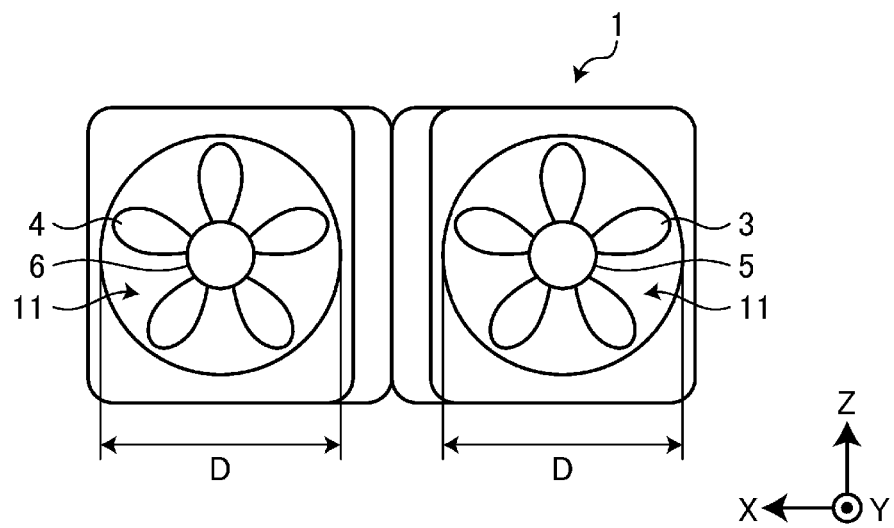
FIG. 6 is a front view illustrating the example.
Figure 7:
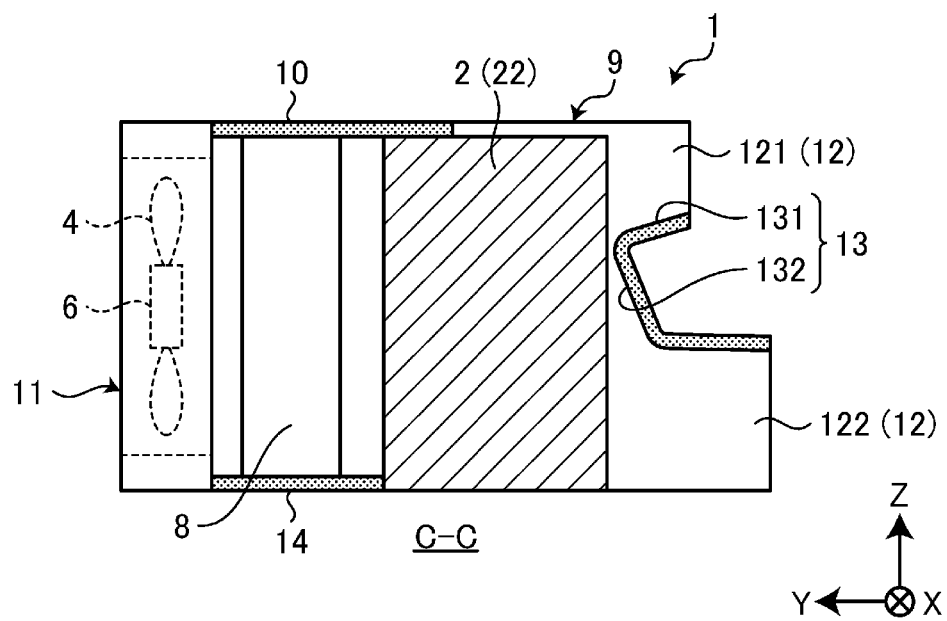
FIG. 7 is a side view illustrating the example.

An arrangement structure of the suction fan 3 and the suction fan 4 in the fan duct 1 will be described with reference to FIGS. 5 to 7. FIG. 5 is a plan view illustrating an example of an arrangement state of the suction fans in the fan duct. FIG. 6 is a front view illustrating the example of the arrangement state of the suction fans in the fan duct. FIG. 7 is a side view illustrating the example of the arrangement state of the suction fans in the fan duct.

As illustrated in FIGS. 5 and 6, the suction fan 3 includes a plurality of blades that rotate around a rotation shaft 5. The suction fan 3 discharges air suctioned from the intake port 11 from a first discharge surface 24. The first discharge surface 24 is a circular region having a diameter D. Similarly, the suction fan 4 includes a plurality of blades that rotate around a rotation shaft 6. The suction fan 4 discharges air suctioned from the intake port 11 from a second discharge surface 25. The second discharge surface 25 is a circular region having the diameter D.

The suction fan 3 and the suction fan 4 have the same size. The sizes of the suction fan 3 and the suction fan 4 are selected such that a sum 2D of the diameter D of the first discharge surface 24 and the diameter D of the second discharge surface 25 is larger than a width W of the heat sink 2.

The first discharge surface 24 from which the suction fan 3 discharges air and the second discharge surface 25 from which the suction fan 4 discharges air are disposed upstream of the heat sink 2 in a manner of being symmetrical relative to a plane 30 that passes through the central position in the width direction of the heat sink 2 and is parallel to the fins 22.

More specifically, in FIG. 5, a deviation angle θ of the first discharge surface 24 relative to the plane 30 and a deviation angle θ of the second discharge surface 25 relative to the plane 30 are set to be equal to each other, and an included angle (2θ) between the first discharge surface 24 and the second discharge surface 25 is set to be 90° or more. That is, the deviation angle θ is set to be 45° or more.

Further, a casing that houses the suction fan 3 and a casing that houses the suction fan 4 are in contact with each other at a position of the plane 30. Accordingly, air discharged by the suction fan 3 and the suction fan 4 do not leak from a space between the casing that houses the suction fan 3 and the casing that houses the suction fan 4.

Since the top plate 10, the bottom plate 14, and the side wall 7 are provided, air discharged from the first discharge surface 24 by the suction fan 3 is guided to the heat sink 2 without leaking to the outside of the fan duct 1. Since the top plate 10, the bottom plate 14, and the side wall 8 are provided, air discharged from the second discharge surface 25 by the suction fan 4 is guided in a direction along the fins 22 of the heat sink 2 without leaking to the outside of the fan duct 1.

The suction fan 3 and the suction fan 4 are provided in the casing 9 of the fan duct 1 in this manner, so that air introduced into the fan duct 1 is guided to the heat sink 2 without leakage. Since a sum of the diameter D of the first discharge surface 24 and the diameter D of the second discharge surface 25 is larger than the width W of the heat sink 2, a larger amount of air can be guided to the fins 22 of the heat sink 2 than that in a case where one suction fan is provided upstream of the fan duct 1. Accordingly, cooling performance of the heat sink 2 can be improved without increasing a size of a suction fan.

As illustrated in FIG. 7, air that passed between the fins 22 of the heat sink 2 reaches the branch wall 13. The branch wall 13 includes the upper wall portion 131 and the lower wall portion 132. The upper wall portion 131 and the lower wall portion 132 are connected by a side along the X axis upstream in an air blowing direction. The upper wall portion 131 and the lower wall portion 132 are inclined relative to the air blowing direction in a manner in which a distance between the upper wall portion 131 and the lower wall portion 132 increases as they are closer to downstream in the air blowing direction. The upper wall portion 131 guides air that passed between the fins 22 of the heat sink 2 obliquely upward and discharges the air from the upper exhaust port 121. The lower wall portion 132 guides air that passed between the fins 22 of the heat sink 2 obliquely downward and discharges the air from the lower exhaust port 122. In this manner, the branch wall 13 guides exhausted air in a manner of avoiding a partial range present downstream of the branch wall 13, and the exhausted air branches. Therefore, even when a peripheral device such as the I/O board 106 (see FIG. 3) is disposed downstream of the branch wall 13, cooling performance of the heat sink 2 is not hindered.

(Other Forms of Arrangement Structure of Suction Fans)

Figure 8:
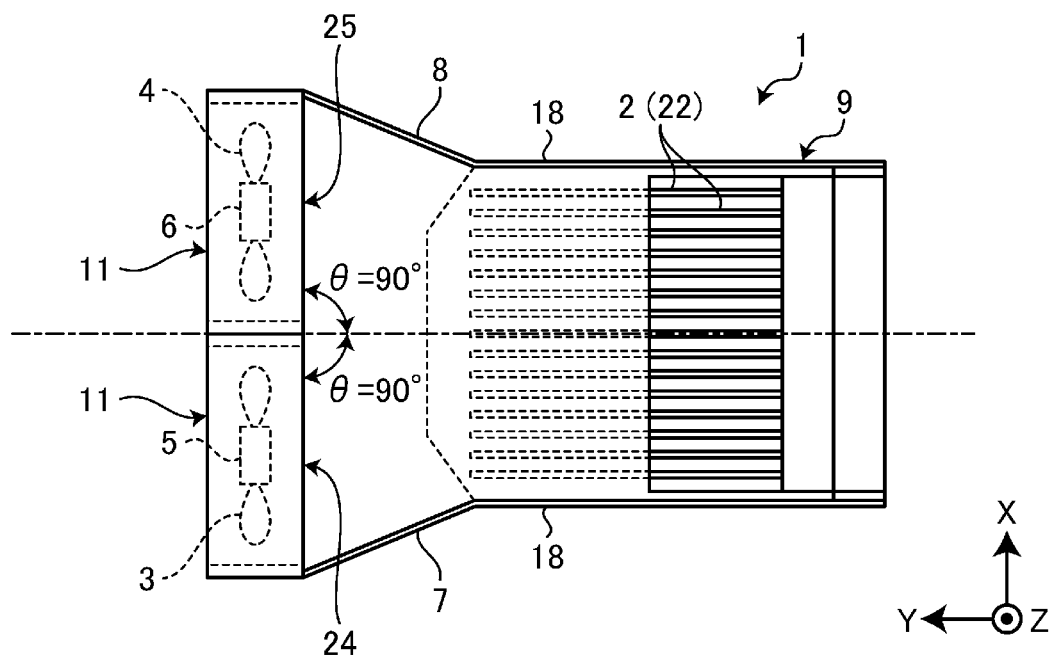
FIG. 8 is a plan view illustrating a second example of the arrangement state.
Figure 9:
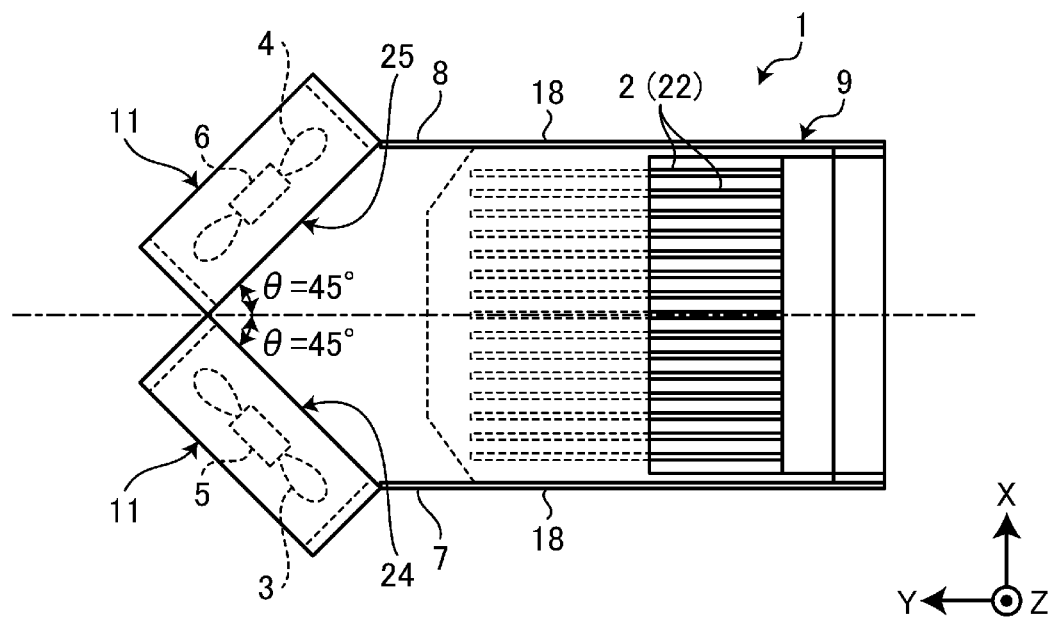
FIG. 9 is a plan view illustrating a third example of the arrangement state.

Other forms of the arrangement structure of the suction fan 3 and the suction fan 4 will be described with reference to FIGS. 8 and 9. FIG. 8 is a plan view illustrating a second example of the arrangement state of the suction fans in the fan duct. FIG. 9 is a plan view illustrating a third example of the arrangement state of the suction fans in the fan duct.

FIG. 8 illustrates an example in which the suction fan 3 and the suction fan 4 are both disposed in a state in which the deviation angle θ=90°. That is, an included angle (2θ) between the suction fan 3 and the suction fan 4 is set to 180°.

According to the arrangement structure illustrated in FIG. 8, air discharged by the suction fan 3 and the suction fan 4 is guided in a direction along the fins 22 of the heat sink 2 without leaking from the casing 9.

FIG. 9 illustrates an example in which the suction fan 3 and the suction fan 4 are disposed in a state in which the deviation angle θ=45°. That is, the included angle (2θ) between the suction fan 3 and the suction fan 4 is 90°.

According to the arrangement structure illustrated in FIG. 9, air discharged by the suction fan 3 and the suction fan 4 is guided in the direction along the fins 22 of the heat sink 2 without leaking from the casing 9. When the deviation angle θ is further reduced, that is, when the included angle (2θ) between the suction fan 3 and the suction fan 4 is set to be smaller than 90°, collision between air discharged from the suction fan 3 and air discharged from the suction fan 4 increases inside the casing 9. As a result, since a disturbance occurs in a flow of the air, an amount of air to be guided in the direction along the fins 22 of the heat sink 2 may be reduced. Accordingly, the included angle (2θ) between the suction fan 3 and the suction fan 4 is preferably set to 90° or more.

Effects of Embodiment

As described above, the fan duct 1 (a cooling device) according to the present embodiment includes the heat sink 2 configured to dissipate heat generated from the electronic apparatus 100 by allowing air introduced from the outside to pass between a plurality of fins 22; the suction fan 3 (a first air blower) that has the first discharge surface 24 for discharging air introduced from the outside toward the heat sink 2; the suction fan 4 (a second air blower) that has the same size as the suction fan 3 and has the second discharge surface 25 for discharging air introduced from the outside toward the heat sink 2; and the exhaust port 12 configured to discharge air that passed between the fins 22 to the outside. A sum of the diameter D of the first discharge surface 24 and the diameter D of the second discharge surface 25 is larger than the width W of the heat sink 2, and the first discharge surface 24 and the second discharge surface 25 are provided upstream of the fins 22 in a manner of being symmetrical relative to a plane with an included angle (2θ) of 90 degrees or more between the first discharge surface 24 and the second discharge surface 25. The plane passes through a central position in a width direction of the heat sink 2 and is parallel to the fins 22. Accordingly, a suction fan can be miniaturized without reducing a discharge amount of cooling air. Since air suctioned by the suction fan 3 and the suction fan 4 can be guided in the direction along the fins 22 of the heat sink 2, cooling performance of the heat sink 2 can be improved.

In the fan duct 1 (the cooling device) according to the present embodiment, a space between an outer edge of the suction fan 3 (the first air blower) and an outer edge in the width direction of the heat sink 2 and a space between an outer edge of the suction fan 4 (the second air blower) and an outer edge in the width direction of the heat sink 2 are covered with the casing 9 having the side walls 7 and 8 (first wall portions) that restrict a flow of air discharged from the first discharge surface 24 and the second discharge surface 25 toward the heat sink 2. Therefore, air suctioned by the suction fan 3 and the suction fan 4 can be guided to the heat sink 2 without leaking from the casing 9. Accordingly, cooling performance of the heat sink 2 can be improved.

In the fan duct 1 (the cooling device) according to the present embodiment, the casing 9 further has the top plate 10 that covers a gap between at least a part of an upper side of the heat sink 2 and the suction fan 3 (the first air blower) and the suction fan 4 (the second air blower). Therefore, air suctioned by the suction fan 3 and the suction fan 4 can be guided to the heat sink 2 without leaking from the casing 9. Accordingly, cooling performance of the heat sink 2 can be improved.

Modifications of Embodiment

Figure 10:
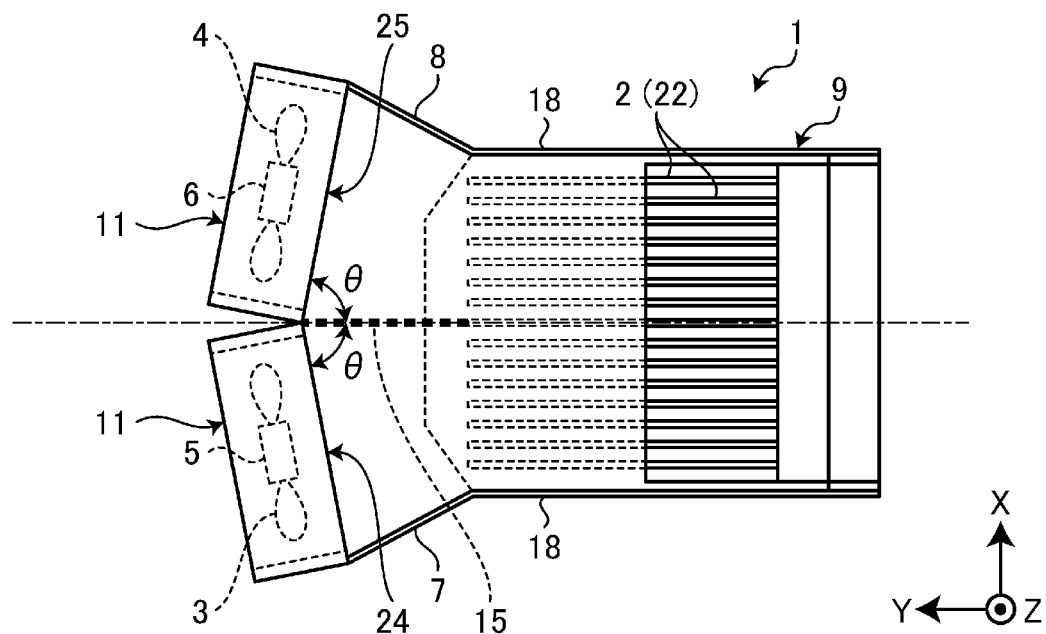
FIG. 10 is a plan view illustrating an example of an arrangement state of suction fans in the fan duct according to a modification.

Modifications of the fan duct 1 will be described with reference to FIGS. 10 to 13. FIG. 10 is a plan view illustrating an example of an arrangement state of suction fans in a fan duct according to a modification of the present embodiment.

The fan duct 1 illustrated in FIG. 10 is different from the fan duct 1 illustrated in FIG. 5 in that a partition wall 15 is provided between inner edges of the suction fan 3 (the first air blower) and the suction fan 4 (the second air blower) and a central position in the width direction of the heat sink 2 to guide air discharged from the first discharge surface 24 and the second discharge surface 25 to the heat sink 2 without mixing the air. For example, the partition wall 15 is formed by raising a rib from the top plate 10 (see FIG. 2) in a Z-axis negative direction. Alternatively, the partition wall 15 may be formed by, for example, raising a rib from the bottom plate 14 (see FIG. 2) in a Z-axis positive direction. The partition wall 15 is an example of a second wall portion disclosed herein.

In this manner, air discharged from the first discharge surface 24 and air discharged from the second discharge surface 25 do not come into contact with each other by providing the partition wall 15, and thus the air discharged from the first discharge surface 24 and the air discharged from the second discharge surface 25 do not affect each other. Accordingly, air suctioned by the suction fan 3 and air suctioned by the suction fan 4 are reliably guided in the direction along the fins 22 of the heat sink 2.

Figure 11:
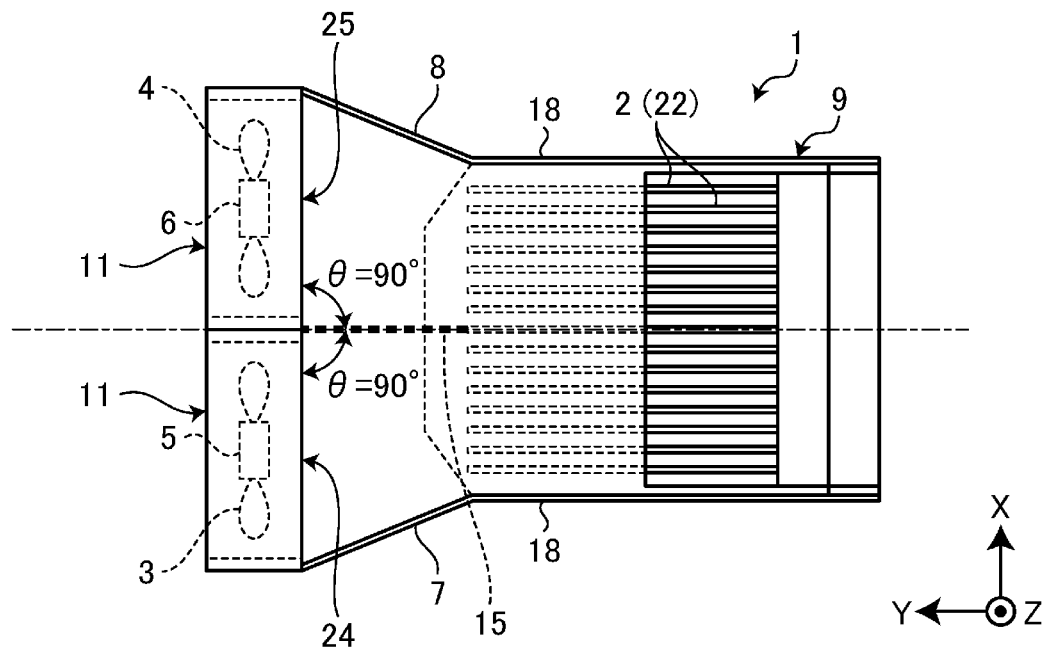
FIG. 11 is a plan view illustrating a second example of an arrangement state of suction fans in the fan duct according to a modification.

FIG. 11 is a plan view illustrating a second example of an arrangement state of suction fans in a fan duct according to a modification of the present embodiment. FIG. 11 illustrates an example in which the suction fan 3 and the suction fan 4 are both disposed in a state in which the deviation angle θ=90°. That is, an included angle (2θ) between the suction fan 3 and the suction fan 4 is set to 180°. The partition wall 15 is provided between inner edges of the suction fan 3 and the suction fan 4 and a central position in the width direction of the heat sink 2 to guide air discharged from the first discharge surface 24 and the second discharge surface 25 to the heat sink 2 without mixing the air.

With the arrangement structure in FIG. 11, air discharged by the suction fan 3 and air discharged by the suction fan 4 are guided in the direction along the fins 22 of the heat sink 2 without being mixed with each other in a similar manner to the arrangement structure in FIG. 10.

Figure 12:
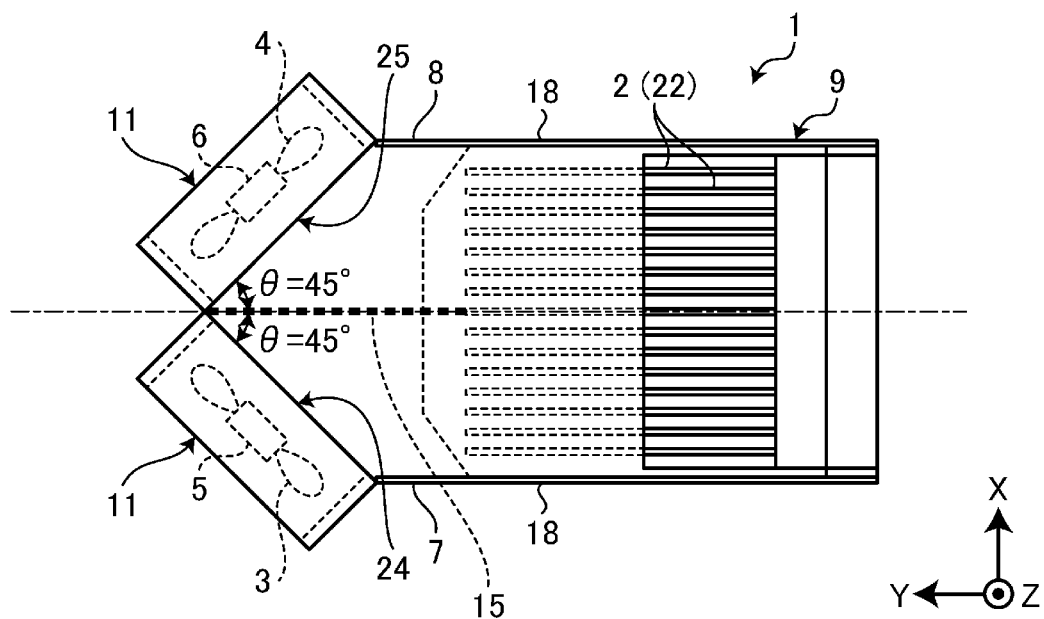
FIG. 12 is a plan view illustrating a third example of an arrangement state of suction fans in the fan duct according to a modification.

FIG. 12 is a plan view illustrating a third example of an arrangement state of suction fans in a fan duct according to a modification of the present embodiment. FIG. 12 illustrates an example in which the suction fan 3 and the suction fan 4 are both disposed in a state in which the deviation angle θ=40°. That is, the included angle (2θ) between the suction fan 3 and the suction fan 4 is set to 90°. The partition wall 15 is provided between inner edges of the suction fan 3 and the suction fan 4 and a central position in the width direction of the heat sink 2 to guide air discharged from the first discharge surface 24 and the second discharge surface 25 to the heat sink 2 without mixing the air.

With the arrangement structure in FIG. 12, air discharged by the suction fan 3 and air discharged by the suction fan 4 are guided in the direction along the fins 22 of the heat sink 2 without being mixed with each other in a similar manner to the arrangement structure in FIG. 10. When the deviation angle θ is further reduced, that is, when the included angle (2θ) between the suction fan 3 and the suction fan 4 is set to be smaller than 90°, air discharged by the suction fan 3 hits the partition wall 15, and thus a flow of the discharged air is disturbed. Since air discharged by the suction fan 4 hits the partition wall 15, a flow of the discharged air is disturbed. As a result, an amount of air guided in the direction along the fins 22 of the heat sink 2 may be reduced. Accordingly, the included angle (2θ) between the suction fan 3 and the suction fan 4 is preferably set to 90° or more.

Figure 13:
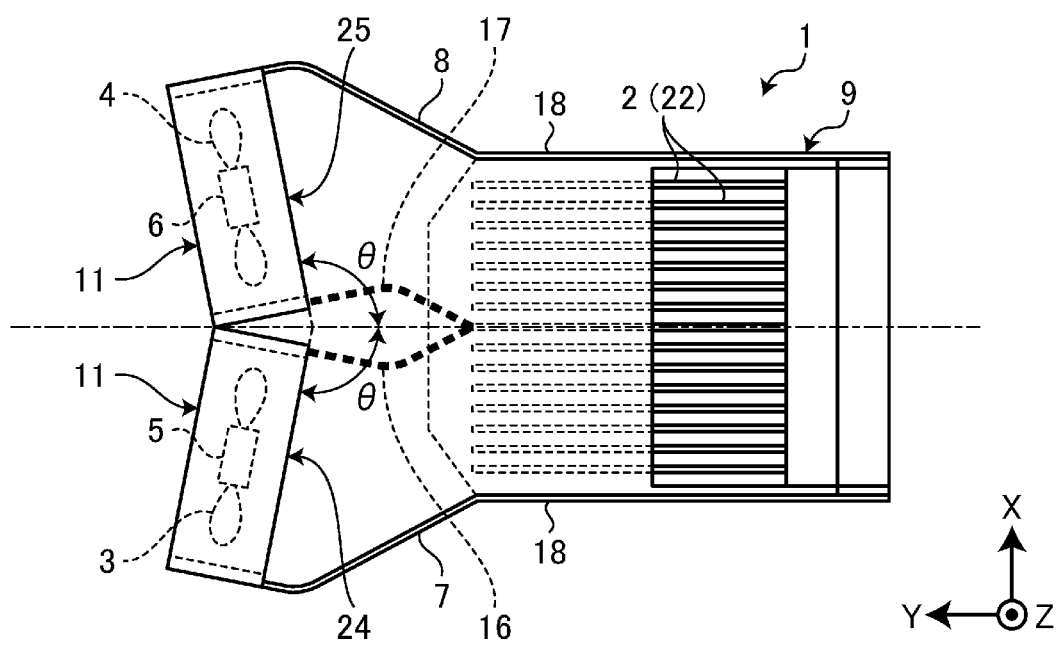
FIG. 13 is a plan view illustrating a fourth example of an arrangement state of suction fans in the fan duct according to a modification.

FIG. 13 is a plan view illustrating a fourth example of an arrangement state of suction fans in a fan duct according to a modification of the present embodiment. FIG. 13 illustrates an example in which the suction fan 3 and the suction fan 4 are both disposed in a state in which the deviation angle θ exceeds 90°. That is, the included angle (2θ) between the suction fan 3 and the suction fan 4 is set to be larger than 180°. Partition walls 16 and 17 are provided between inner edges of the suction fan 3 and the suction fan 4 and a central position in the width direction of the heat sink 2 to guide air discharged from the first discharge surface 24 and the second discharge surface 25 to the heat sink 2 without mixing the air. The partition wall 16 is disposed between the inner edge of the suction fan 3 and the central position in the width direction of the heat sink 2, and guides air discharged from the first discharge surface 24 in the direction along the fins 22 of the heat sink 2 without mixing with air discharged from the second discharge surface 25. The partition wall 17 is disposed between the inner edge of the suction fan 4 and the central position in the width direction of the heat sink 2, and guides air discharged from the second discharge surface 25 in the direction along the fins 22 of the heat sink 2 without mixing with air discharged from the first discharge surface 24.

In FIG. 13, the side wall 7 and the partition wall 16 are formed in a curved state so as to guide air discharged from the first discharge surface 24 to the heat sink 2 without disturbing a flow of the air as much as possible. The side wall 8 and the partition wall 17 are formed in a curved state so as to guide air discharged from the second discharge surface 25 to the heat sink 2 without disturbing a flow of the air as much as possible.

Effects of Modifications of Embodiment

As described above, the fan duct 1 (the cooling device) according to the modification of the embodiment includes the partition wall 15 (the second wall portion) between the inner edges of the suction fan 3 (the first air blower) and the suction fan 4 (the second air blower) and the central position in the width direction of the heat sink 2 to guide air discharged from the first discharge surface 24 and the second discharge surface 25 to the heat sink 2 without mixing the air. Therefore, air suctioned by the suction fan 3 and the suction fan 4 can be guided to the heat sink 2 without being mixed. Accordingly, interference of air suctioned by the two suction fans can be prevented, and thus cooling performance of the heat sink 2 can be improved.

While certain embodiments are described, these embodiments have been presented by way of examples only, and are not intended to limit the scope of the disclosure. Novel embodiments can be implemented in various other forms, and various omissions, substitutions, and modifications may be made within a scope not departing from the spirit of the disclosure. The embodiments and modifications are included in the scope and the gist of the disclosure, and included in the inventions described in the claims and the scope of equivalents of the inventions.

What is claimed is:

1. A cooling device for an electronic apparatus, comprising:
   a heat sink configured to dissipate heat generated from the electronic apparatus by allowing air introduced from an outside to pass between a plurality of fins;
   a first air blower that comprises a first discharge surface for discharging air introduced from the outside toward the heat sink;
   a second air blower having the same size as the first air blower and comprises a second discharge surface for discharging air introduced from the outside toward the heat sink; and
   an exhaust port configured to discharge air that passes between the fins to the outside, the exhaust port comprising an upper exhaust port and a lower exhaust port separate from the upper exhaust port by a branch wall, wherein
   a sum of a diameter of the first discharge surface and a diameter of the second discharge surface is larger than a width of the heat sink, and the first discharge surface and the second discharge surface are provided upstream of the fins so as to be symmetrical relative to a plane with an included angle of 90 degrees or more between the first discharge surface and the second discharge surface, the plane passing through a central position in a width direction of the heat sink and being parallel to the fins.

2. The cooling device according to claim 1, wherein
   a space between an outer edge of the first air blower and an outer edge in the width direction of the heat sink and a space between an outer edge of the second air blower and an outer edge in the width direction of the heat sink are covered with a casing comprising first wall portions that restrict a flow of air discharged from the first discharge surface and the second discharge surface toward the heat sink.

3. The cooling device according to claim 2, wherein
   the casing further comprises a second wall portion provided between inner edges of the first air blower and the second air blower and the central position in the width direction of the heat sink, and that guides air discharged from the first discharge surface and the second discharge surface to the heat sink without mixing the air.

4. The cooling device according to claim 2, wherein
   the casing further comprises a top plate that covers a gap between at least a part of an upper side of the heat sink and the first air blower and the second air blower.

5. The cooling device according to claim 2, wherein
   the casing further comprises a plurality of ventilation holes.

6. The cooling device according to claim 1, wherein the heat sink is fixed by a helical spring and a screw on a plurality of frames.

7. The cooling device according to claim 1, wherein the electronic apparatus comprises a mother board.

8. The cooling device according to claim 1, wherein the electronic apparatus comprises a CPU.

9. A computing device, comprising:
   a CPU; and
   a cooling device comprising:
   a heat sink configured to dissipate heat generated from the CPU by allowing air introduced from an outside of the computing device to pass between a plurality of fins;
   a first air blower that comprises a first discharge surface for discharging air introduced from the outside toward the heat sink;
   a second air blower having the same size as the first air blower and comprises a second discharge surface for discharging air introduced from the outside toward the heat sink; and
   an exhaust port configured to discharge air that passes between the fins to the outside, the exhaust port comprising an upper exhaust port and a lower exhaust port separate from the upper exhaust port by a branch wall, wherein
   a sum of a diameter of the first discharge surface and a diameter of the second discharge surface is larger than a width of the heat sink, and the first discharge surface and the second discharge surface are provided upstream of the fins so as to be symmetrical relative to a plane with an included angle of 90 degrees or more between the first discharge surface and the second discharge surface, the plane passing through a central position in a width direction of the heat sink and being parallel to the fins.

10. The computing device according to claim 9, wherein
    a space between an outer edge of the first air blower and an outer edge in the width direction of the heat sink and a space between an outer edge of the second air blower and an outer edge in the width direction of the heat sink are covered with a casing comprising first wall portions that restrict a flow of air discharged from the first discharge surface and the second discharge surface toward the heat sink.

11. The computing device according to claim 10, wherein
    the casing further comprises a second wall portion provided between inner edges of the first air blower and the second air blower and the central position in the width direction of the heat sink, and that guides air discharged from the first discharge surface and the second discharge surface to the heat sink without mixing the air.

12. The computing device according to claim 10, wherein the casing further comprises a top plate that covers a gap between at least a part of an upper side of the heat sink and the first air blower and the second air blower.

13. The computing device according to claim 10, wherein the casing further comprises a plurality of ventilation holes.

14. The computing device according to claim 9, wherein the heat sink is fixed by a helical spring and a screw on a plurality of frames.

15. The computing device according to claim 9, further comprising a mother board.

16. A heat reduction method for an electronic apparatus, comprising:
dissipating heat generated from the electronic apparatus by allowing air introduced from an outside to pass between a plurality of fins comprised in a heat sink;
discharging air introduced from the outside toward the heat sink using a first air blower that comprises a first discharge surface;
discharging air introduced from the outside toward the heat sink using a second air blower having the same size as the first air blower and comprises a second discharge surface; and
discharging air that passes between the fins to the outside through an exhaust port, the exhaust port comprising an upper exhaust port and a lower exhaust port separate from the upper exhaust port by a branch wall, wherein
a sum of a diameter of the first discharge surface and a diameter of the second discharge surface is larger than a width of the heat sink, and the first discharge surface and the second discharge surface are provided upstream of the fins so as to be symmetrical relative to a plane with an included angle of 90 degrees or more between the first discharge surface and the second discharge surface, the plane passing through a central position in a width direction of the heat sink and being parallel to the fins.

17. The heat reduction method according to claim 16, wherein
a space between an outer edge of the first air blower and an outer edge in the width direction of the heat sink and a space between an outer edge of the second air blower and an outer edge in the width direction of the heat sink are covered with a casing comprising first wall portions that restrict a flow of air discharged from the first discharge surface and the second discharge surface toward the heat sink.

18. The heat reduction method according to claim 17, wherein
the casing further comprises a second wall portion provided between inner edges of the first air blower and the second air blower and the central position in the width direction of the heat sink, and that guides air discharged from the first discharge surface and the second discharge surface to the heat sink without mixing the air.

19. The heat reduction method according to claim 17, wherein
the casing further comprises a top plate that covers a gap between at least a part of an upper side of the heat sink and the first air blower and the second air blower.

20. The heat reduction method according to claim 17, wherein
the casing further comprises a plurality of ventilation holes.

* * * * *